United States Patent
Wu et al.

(10) Patent No.: US 10,888,025 B2
(45) Date of Patent: Jan. 5, 2021

(54) FIXING FRAME ASSEMBLY AND SERVER

(71) Applicant: Wistron Corp., New Taipei (TW)

(72) Inventors: Yu-Jian Wu, New Taipei (TW);
Zhi-Tao Yu, New Taipei (TW);
Chia-Hsin Liu, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/290,033

(22) Filed: Mar. 1, 2019

(65) Prior Publication Data
US 2020/0146185 A1    May 7, 2020

(30) Foreign Application Priority Data

Nov. 5, 2018 (CN) .......................... 2018 1 1308772

(51) Int. Cl.
*H05K 7/20* (2006.01)
*H01R 13/518* (2006.01)
*H05K 7/14* (2006.01)
*H01R 13/631* (2006.01)
*H01R 33/88* (2006.01)
*H01R 12/71* (2011.01)

(52) U.S. Cl.
CPC ....... *H05K 7/20727* (2013.01); *H01R 13/518* (2013.01); *H01R 13/631* (2013.01); *H01R 33/88* (2013.01); *H05K 7/1487* (2013.01); *H01R 12/716* (2013.01)

(58) Field of Classification Search
CPC .... H05K 7/1487; H05K 5/023; H05K 7/1409; H05K 7/20727; H01R 12/716; H01R 13/518; H01R 13/631; H01R 33/88
See application file for complete search history.

(56) References Cited

U.S. PATENT DOCUMENTS

| | | | |
|---|---|---|---|
| 7,400,936 B2 * | 7/2008 | Chang .................... | G06F 1/184 361/679.33 |
| 7,771,218 B2 * | 8/2010 | Jaramillo ............. | H05K 7/1492 439/157 |
| 9,826,658 B1 * | 11/2017 | Mao ........................ | G06F 1/183 |
| 2012/0087084 A1 * | 4/2012 | Nguyen .................. | G06F 1/187 361/679.37 |

* cited by examiner

*Primary Examiner* — James Wu
(74) *Attorney, Agent, or Firm* — Locke Lord LLP; Tim Tingkang Xia, Esq.

(57) ABSTRACT

A fixing frame assembly configured to be assembled to assembling pillar of chassis includes accommodating frame, at least one installation plate and at least one operative component. Accommodating frame has at least one guiding pillar. Installation plate is slidably disposed on a side of accommodating frame. Installation plate includes at least one guiding slot, connection slot and installation slot. Guiding pillar is slidably located in guiding slot. Installation slot is configured to accommodate assembling pillar. Operative component is pivotably disposed on accommodating frame and has connection protrusion. Connection protrusion is slidably located in connection slot. Operative component is able to be pivoted with respect to accommodating frame so that connection protrusion forces installation plate to be slid with respect to accommodating frame, thereby moving the accommodating frame with respect to chassis through the cooperation of accommodating frame and installation plate.

16 Claims, 12 Drawing Sheets

FIXING FRAME ASSEMBLY AND SERVER

CROSS-REFERENCE TO RELATED APPLICATIONS

This non-provisional application claims priority under 35 U.S.C. § 119(a) on Patent Application No(s). 201811308772.6 filed in China, on Nov. 5, 2018, the entire contents of which are hereby incorporated by reference.

BACKGROUND OF THE INVENTION

Technical Field of the Invention

The disclosure relates to a fixing frame assembly and a server, more particularly to a fixing frame assembly having an installation slot and a server having the same.

Description of the Related Art

Server provides various services, such as cloud drive, gamming platform, big data analysis to the internet. With the improvement of the server performance, the heat generated by the server is largely increased. Generally, there are fan modules disposed within the server for enhancing heat dissipation, and the fan modules are usually stacked above the mainboard because the inner space of the server is very limited. Therefore, before the removal of the mainboard, the fan modules are required to be removed.

SUMMARY OF THE INVENTION

One embodiment of this disclosure provides a fixing frame assembly, configured to be mounted to an assembling pillar of a chassis. The fixing frame assembly includes an accommodating frame, at least one installation plate, and at least one operative component. The accommodating frame has at least one guiding pillar. The at least one installation plate is slidably disposed on a side of the accommodating frame. The at least one installation plate includes at least one guiding slot, a connection slot and an installation slot. The at least one guiding pillar is slidably located in the at least one guiding slot, and the assembling pillar is configured to be slidably located in the installation slot. The at least one operative component is pivotably disposed on the accommodating frame and has a connection protrusion. The connection protrusion is slidably located in the connection slot. The operative component is allowed to be pivoted with respect to the accommodating frame so as to force the connection protrusion to move the at least one installation plate with respect to the accommodating frame, thereby forcing the accommodating frame to move with respect to the chassis through the cooperation of the accommodating frame and the at least one installation plate.

Another embodiment of this disclosure provides a server including a chassis, a mother board, at least one fan, and a fixing frame assembly. The chassis includes a casing and two guiding components. The two guiding components are disposed in the casing and the two guiding components respectively have a guiding groove and an assembling pillar. The mother board has at least one first connector. The at least one fan has a second connector. The fixing frame assembly includes an accommodating frame, two installation plates, and two operative components. The at least one fan is disposed on the accommodating frame. The accommodating frame has two guiding pillars. Two installation plates are respectively slidably disposed on two opposite sides of the accommodating frame. The two installation plates each include at least one guiding slot, a connection slot and an installation slot. The two guiding pillars are respectively disposed through the two guiding slots and are respectively partially slidably located in the two guiding slots. The two assembling pillars are respectively configured to be located on the two installation slots. The two operative components are respectively pivotably disposed on two opposite sides of the accommodating frame and each have a connection protrusion. The two connection protrusions are respectively slidably located in the two connection slots. The two operative components are able to be pivoted with respect to the accommodating frame so that the two connection protrusions respectively force the two installation plates to be slid with respect to the accommodating frame. Due to a cooperation of the accommodating frame and the two installation plates, when the operative component is pivoted with respect to the accommodating frame, the accommodating frame is moved with respect to the chassis. When the accommodating frame relatively is located close to the chassis, the second connector of the at least one fan is inserted into the first connector of the mother board. When the accommodating frame is relatively away from the chassis, the second connector of the at least one fan is detached from the first connector of the mother board.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
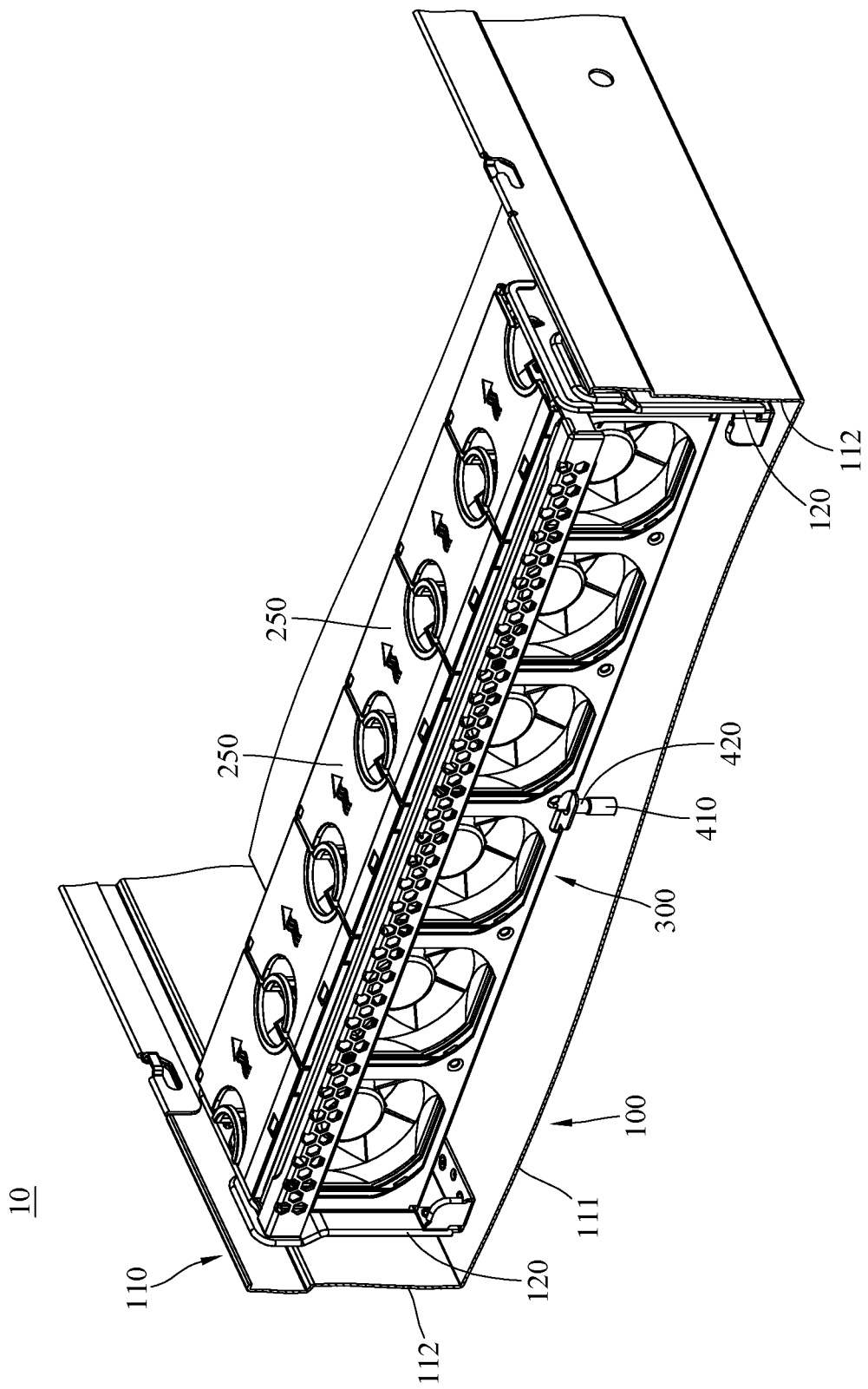
FIG. 1 is a partial perspective schematic view of a server according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
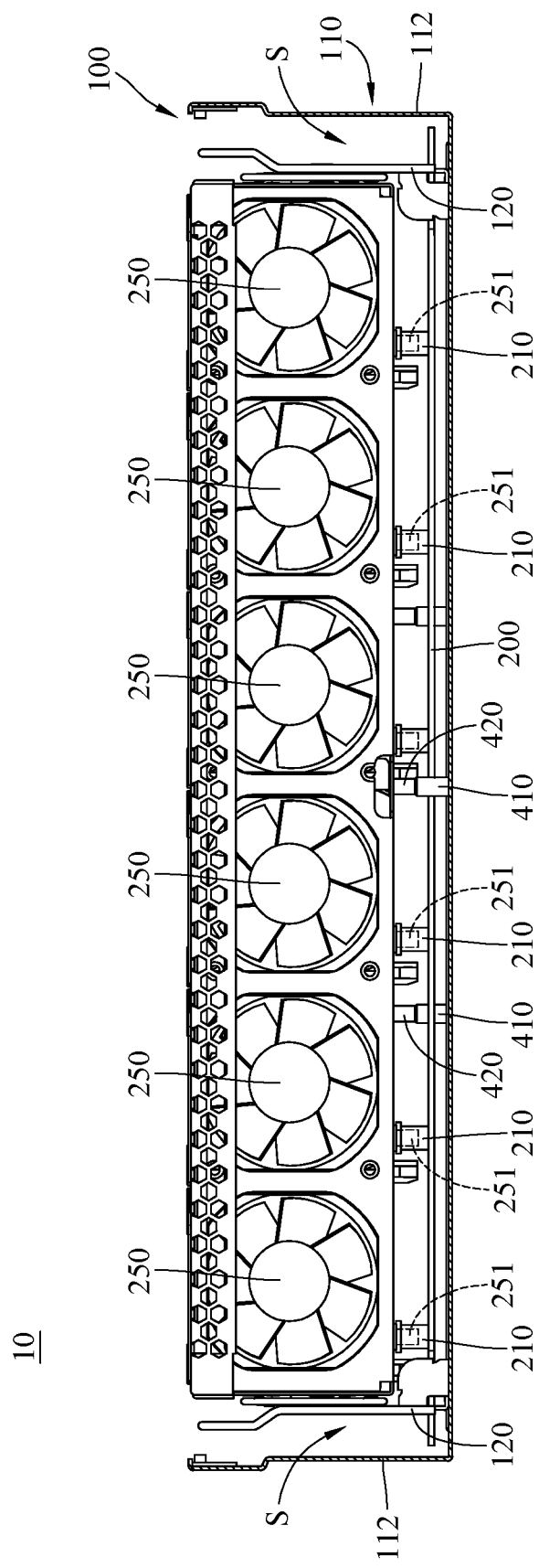
FIG. 2 is a front schematic view of FIG. 1.
Figure 3:
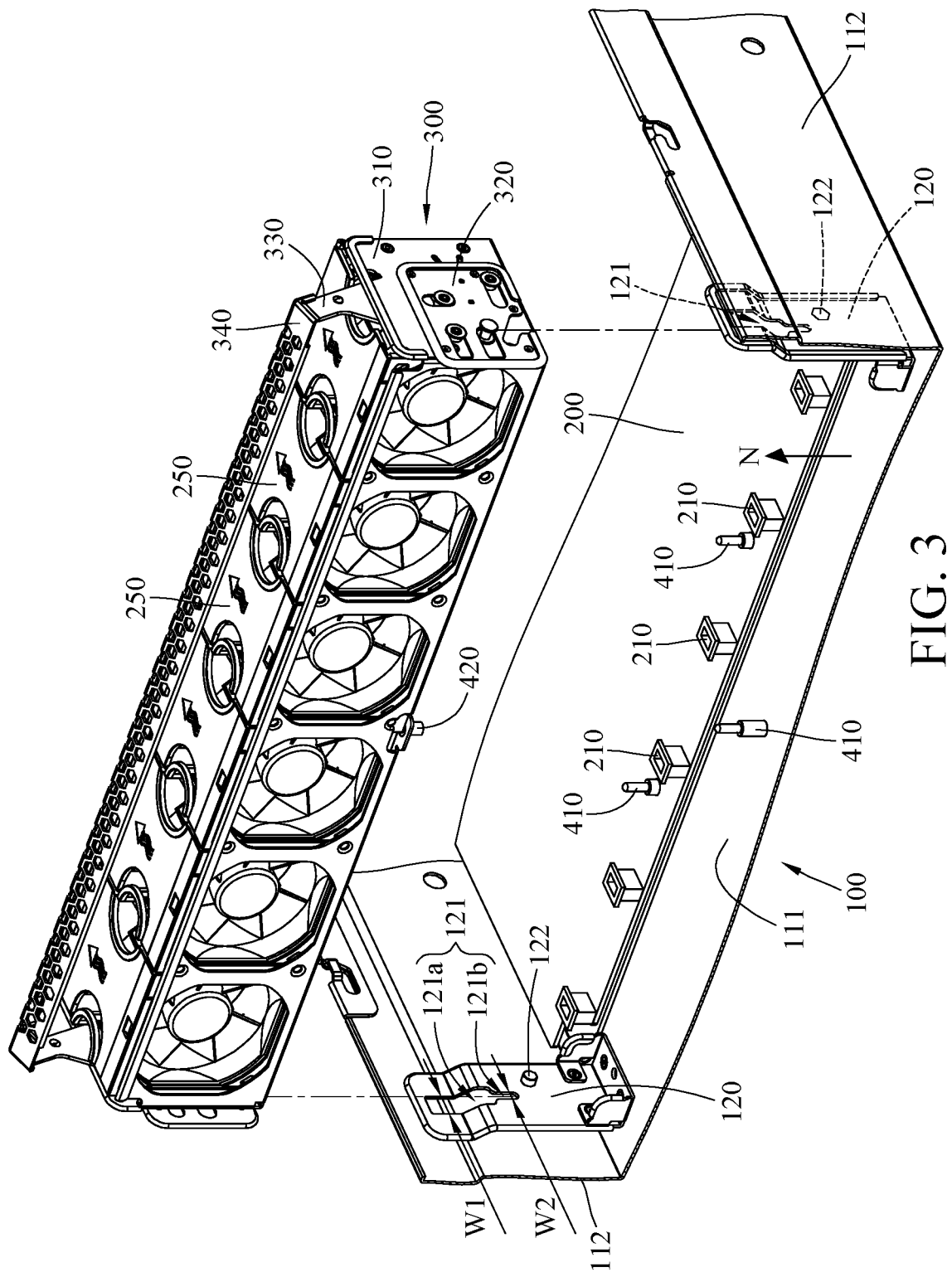
FIG. 3 is an exploded schematic view of FIG. 1.
Figure 4:
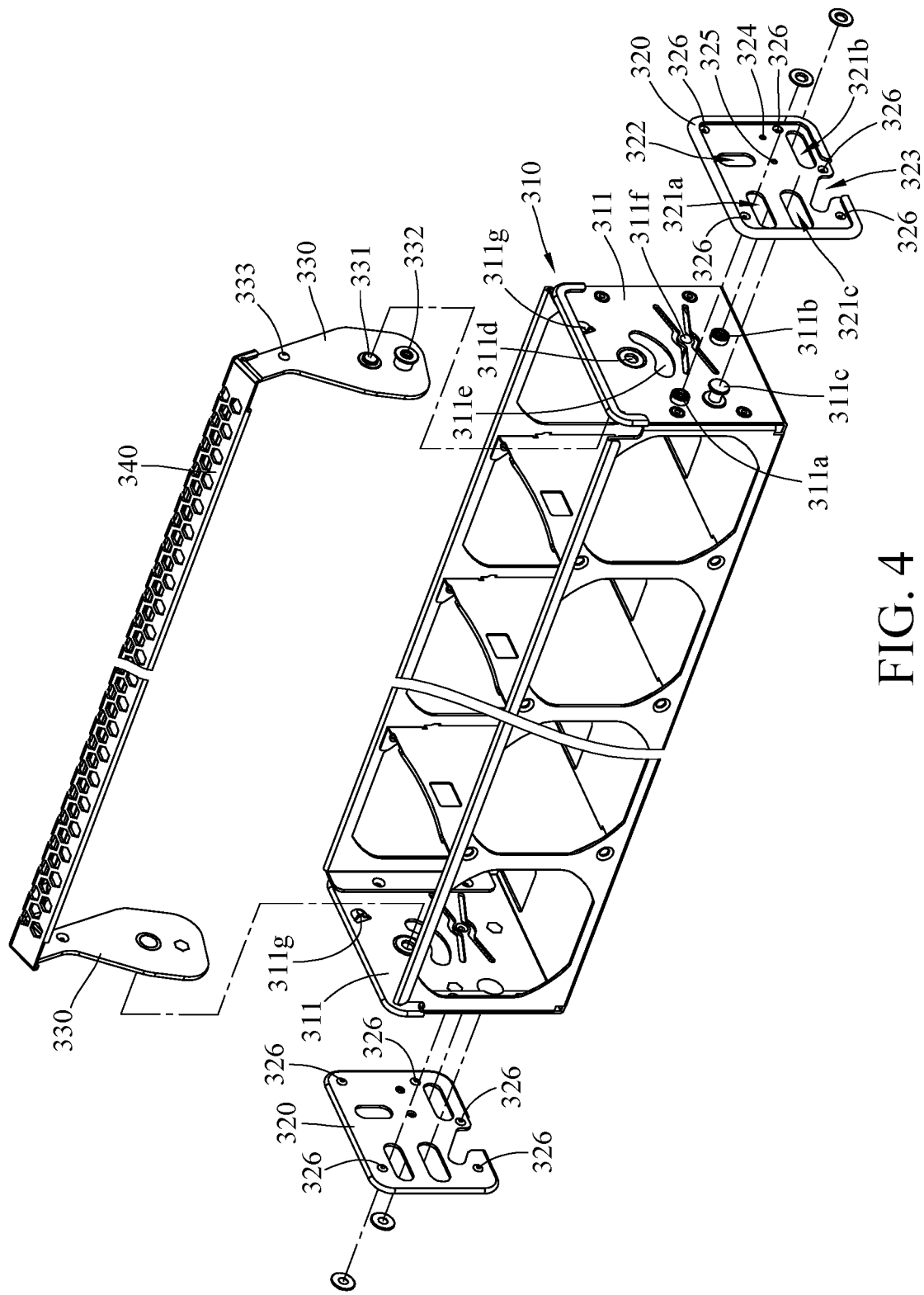
FIG. 4 is an exploded schematic view of a fixing frame assembly in FIG. 3.

Please refer to FIG. 1 to FIG. 4. FIG. 1 is a partial perspective schematic view of a server according to a first embodiment of the disclosure. FIG. 2 is a front schematic view of FIG. 1. FIG. 3 is an exploded schematic view of FIG. 1. FIG. 4 is an exploded schematic view of a fixing frame assembly in FIG. 3.

As shown in FIG. 1 and FIG. 2, this embodiment provides a server 10. The server 10 is, for example, a 1U or 2U server. The server 10 includes a chassis 100, a motherboard 200, a plurality of fans 250 and a fixing frame assembly 300. The chassis 100 includes a casing 110 and two guiding components 120. The two guiding components 120 are disposed in the casing 110, and the two guiding components 120 each have a guiding groove 121 and an assembling pillar 122. The motherboard 200 may have a plurality of first connectors 210. The fans 250 each have a second connector 251.

As shown in FIG. 3 and FIG. 4, the fixing frame assembly 300 includes an accommodating frame 310, two installation plates 320 and two operative components 330. The fans 250 are mounted in the accommodating frame 310. The accommodating frame 310 may further include two side plates 311 that are opposite to each other, and the two side plates 311 each have a plurality of guiding pillars 311a, 311b and 311c.

The two installation plates 320 are respectively slidably disposed on two opposite sides of the accommodating frame 310. The two installation plates 320 each have a plurality of guiding slots 321a, 321b and 321c, a connection slot 322 and an installation slot 323.

Note that only one side of the accommodating frame 310 and one of the installation plates 320 may be described in detail hereinafter.

The guiding pillars 311a, 311b and 311c are respectively disposed through and slidably located on the guiding slots 321a, 321b and 321c. The assembling pillar 122 is configured to be slidably located on the installation slot 323. Due to the cooperation of the accommodating frame 310 and the installation plate 320, the accommodating frame 310 can be moved with respect to the chassis 100 when the operative component 330 is pivoted with respect to the accommodating frame 310.

Note that the quantity of the guiding slots on one of the installation plates 320 is not restricted. In other embodiments, each installation plate may only have one guiding slot.

As shown in FIG. 3 and FIG. 4, the two operative components 330 are respectively pivotably disposed on two opposite sides of the accommodating frame 310.

The side plate 311 of the accommodating frame 310 may further have a first pivot structure 311d. The operative component 330 has a second pivot structure 331. The first pivot structure 311d and the second pivot structure 331 are pivot shaft and pivot hole that fit each other. The second pivot structure 331 is pivotably inserted into the first pivot structure 311d, allowing the operative component 330 to be pivoted with respect to the accommodating frame 310. However, how the operative component 330 is pivoted to the accommodating frame 310 is not limited by the configuration of the first pivot structure 311d and the second pivot structure 331.

In addition, the operative component 330 has a connection protrusion 332 configured to be slidably inserted into the connection slot 322. When the operative component 330 is pivoted with respect to the accommodating frame 310, the connection protrusion 332 is forced to slide the installation plate 320 with respect to the accommodating frame 310. Due to the cooperation of the accommodating frame 310 and the installation plate 320, the accommodating frame 310 can be moved with respect to the chassis 100 when the operative component 330 is pivoted with respect to the accommodating frame 310.

Figure 7:
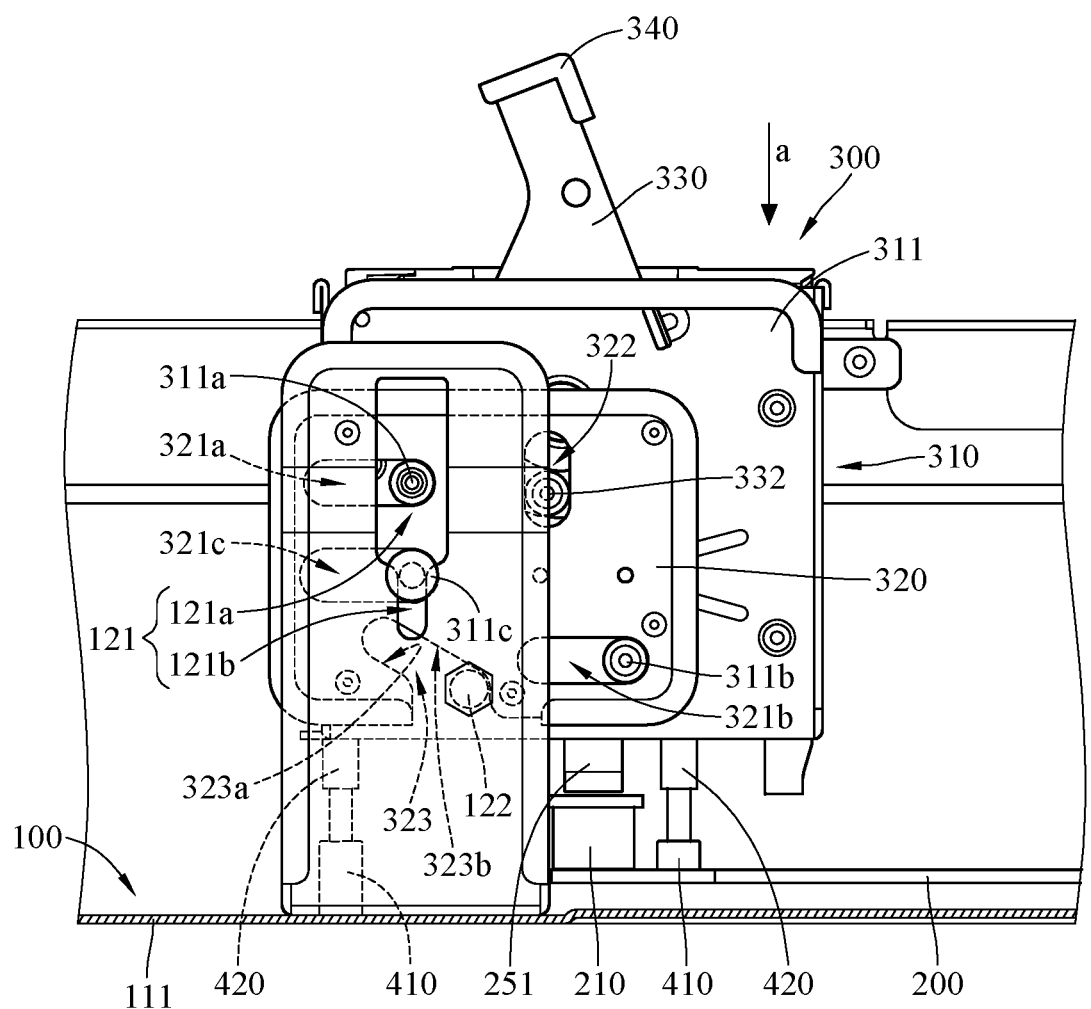
FIG. 7 is a cross-sectional view showing that the fixing frame assembly is located inside the chassis and the installation plate is not assembled to a guiding component.
Figure 8:
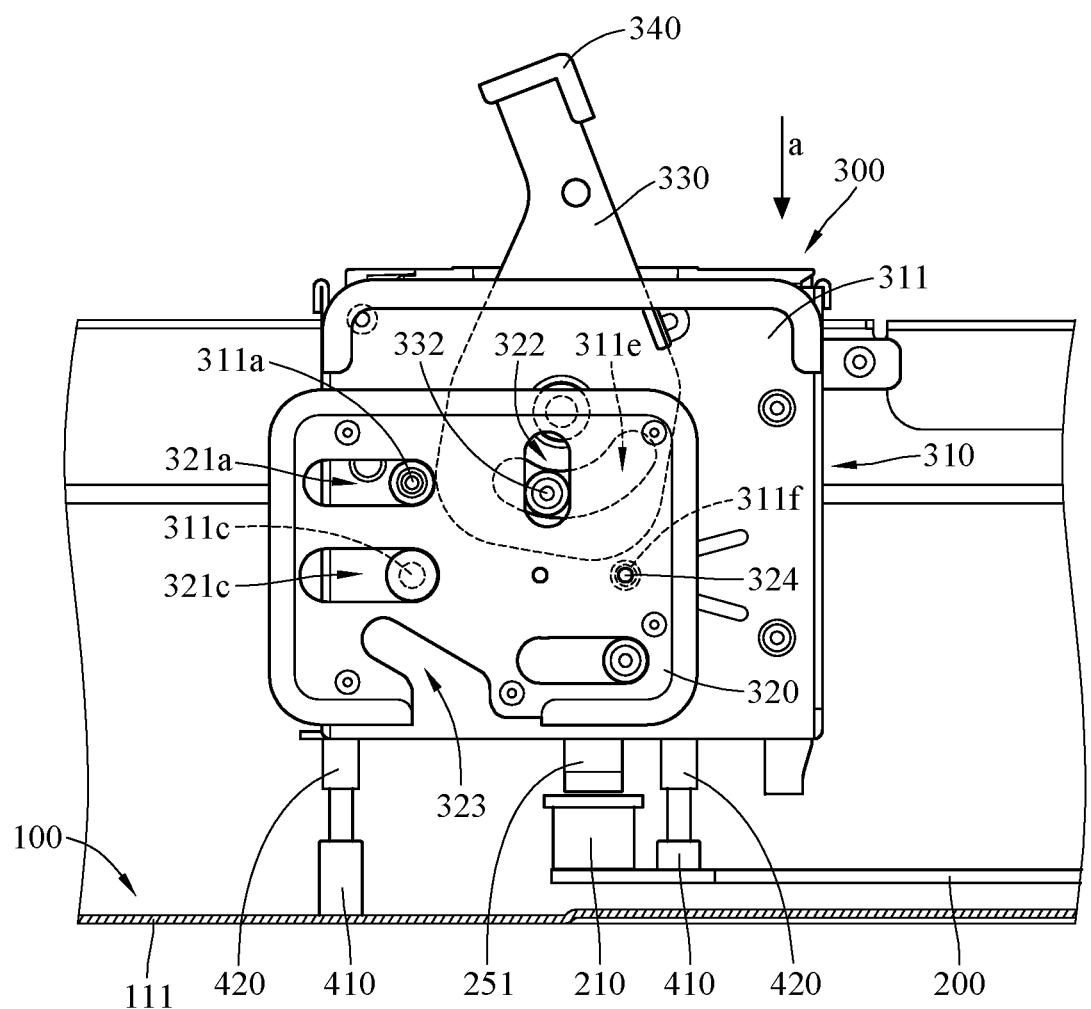
FIG. 8 is another cross-sectional view showing that the fixing frame assembly is located inside the chassis and the installation plate is not assembled to the guiding component.
Figure 9:
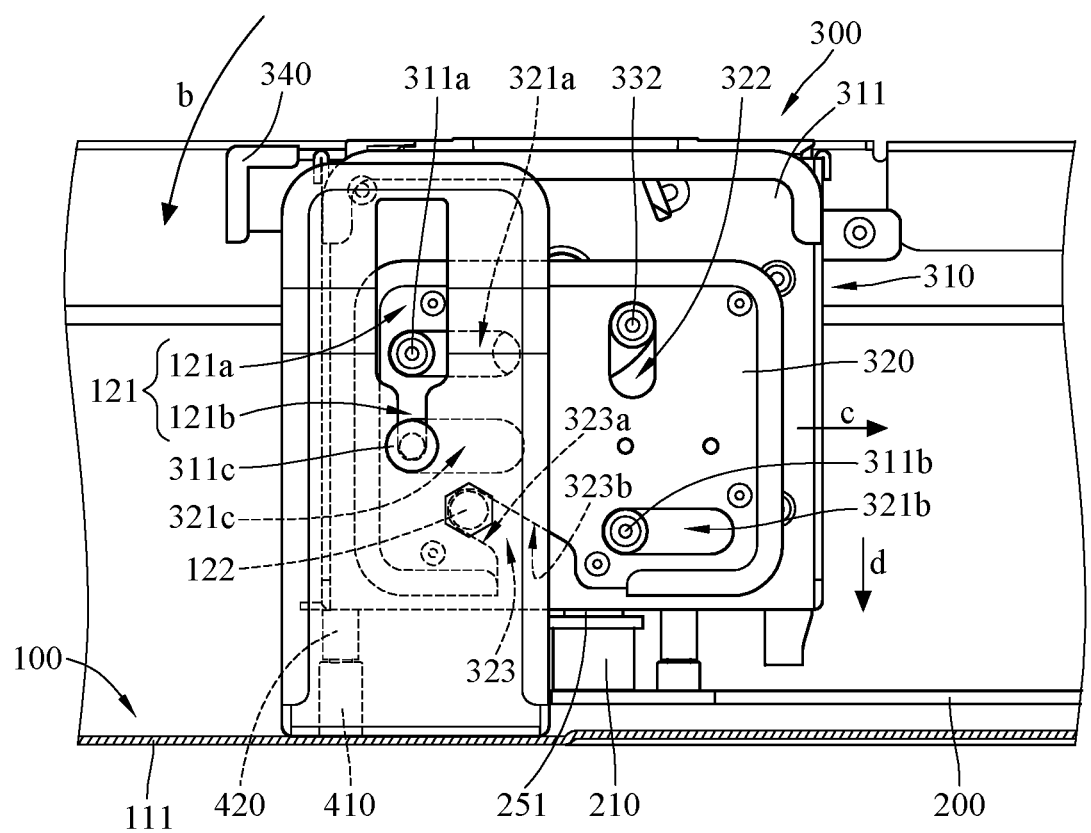
FIG. 9 is a cross-sectional view showing that the fixing frame assembly is located inside the chassis and the installation plate is assembled to the guiding component.
Figure 10:
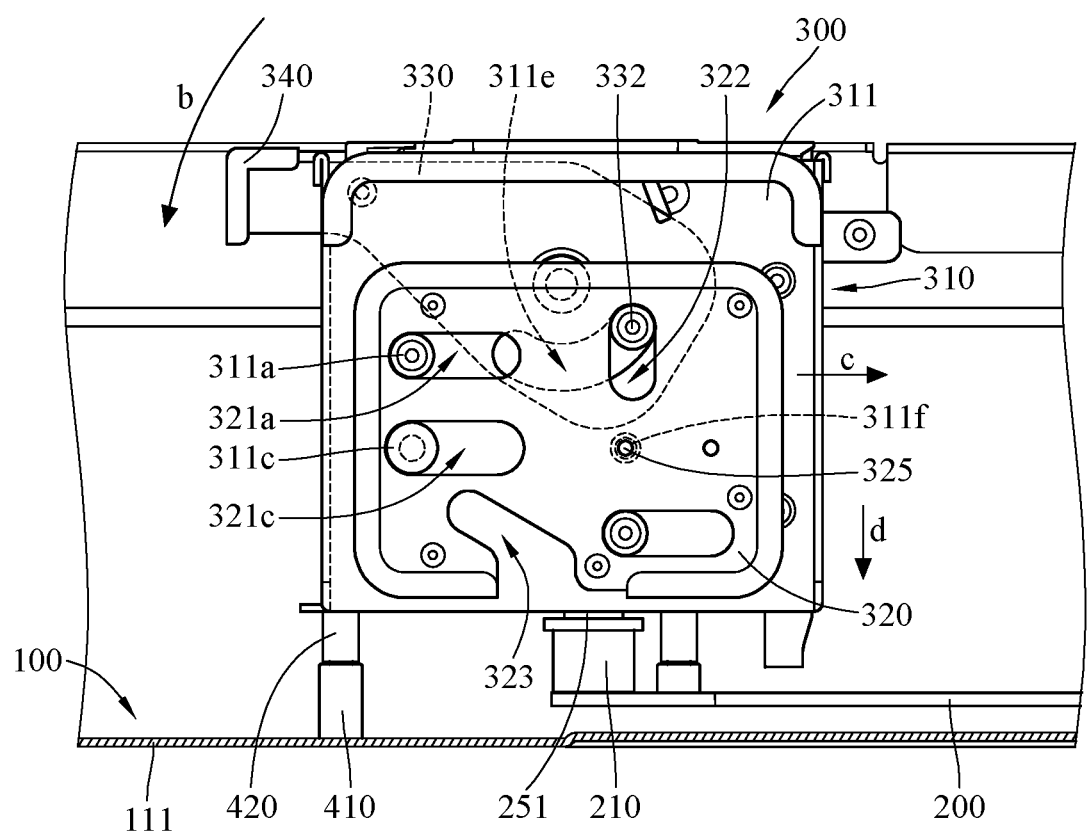
FIG. 10 is another cross-sectional view showing that the fixing frame assembly is located inside the chassis and the installation plate is assembled to the guiding component.

When the accommodating frame 310 is relatively close to the chassis 100 (as shown in FIGS. 9 and 10), the second connectors 251 of the fans 250 are respectively electrically connected to the first connectors 210 of the motherboard 200. When the accommodating frame 310 is relatively away from the chassis 100 (as shown in FIGS. 7 and 8), the second connectors 251 of the fans 250 are respectively disconnected from the first connectors 210 of the motherboard 200. The detail mounting operations are described below.

As shown in FIG. 3, in this and other embodiments, the fixing frame assembly 300 may further include a link 340. The link 340 are connected to the two operative components 330 so as to be moved with the two operative components 330 simultaneously. However, the link 340 is optional; in other embodiments, the fixing frame assembly may not include the link, and the operative components may be pivoted independently.

As shown in FIG. 3 and FIG. 4, in this and other embodiments, the casing 110 may further include a bottom wall 111 and two side walls 112. The two side walls 112 are respectively connected to two opposite sides of the bottom wall 111. The two guiding components 120 are disposed on the bottom wall 111 via, for example, rivets. The two guiding components 120 are located between the two side walls 112. The guiding components 120 are respectively spaced apart from the side walls 112 by two cable management spaces S. That is, one of the cable management spaces S is formed between one of the guiding components 120 and one of the side walls 112, and the other cable management space S is formed between the other guiding component 120 and the other side wall 112. The cable management spaces S are configured to accommodate cables (not shown).

As shown in FIG. 3 and FIG. 4, in this and other embodiments, each guiding groove 121 may further have a release portion 121a and an engagement portion 121b that are connected to each other. In each guiding groove 121, a width W1 of the release portion 121a is larger than a width W2 of the engagement portion 121b, and the engagement portion 121b is located closer to the bottom wall 111 than the release portion 121a. When the accommodating frame 310 is relatively close to the bottom wall 111 of the chassis 100, the two guiding pillars 311c are respectively located in the two engagement portions 121b, such that the accommodating frame 310 is fixed to the guiding components 120. When the accommodating frame 310 is relatively away from the bottom wall 111 of the chassis 100, the guiding pillars 311c are respectively located in the release portions 121a, such that the accommodating frame 310 is allowed to be detached from the guiding components 120.

As shown in FIG. 3 and FIG. 4, in this and other embodiments, the server 10 may further include a plurality of first positioning pillars 410 and a plurality of second positioning pillars 420. The first positioning pillars 410 and the second positioning pillars 420 have concave and convex structures that fit to each other. In detail, the first positioning pillars 410 are, for example, solid and are disposed on the bottom wall 111. The second positioning pillars 420 are, for example, hollow and are disposed on the accommodating frame 310. When the fixing frame assembly 300 is disposed on the chassis 100, the first positioning pillars 410 are respectively detachably inserted into the second positioning pillars 420. Note that the quantities of the first positioning pillars 410 and the second positioning pillars 420 are not restricted; in other embodiments, the server may only include one first positioning pillar 410 and one second positioning pillar 420. In addition, the configurations of the first positioning pillars 410 and the second positioning pillars 420 are not restricted; in another embodiment, the first positioning pillar may be hollow and the second positioning pillars may be solid.

As shown in FIG. 4, in this and other embodiments, the side plate 311 may further have an opening 311e. The connection protrusion 332 of the operative component 330 is disposed through and slidably located in the opening 311e, thereby guiding the operative component 330 with respect to the accommodating frame 310.

As shown in FIG. 4, in this and other embodiments, the installation plate 320 may further have a plurality of bumps 326. The installation plate 320 presses against the side plate 311 of the accommodating frame 310 via the bumps 326, achieving points contact and thus reducing the contact area between the installation plate 320 and the side plate 311. As a result, the installation plate 320 is able to be moved with respect to the accommodating frame 310 in a smooth manner.

Figure 5:
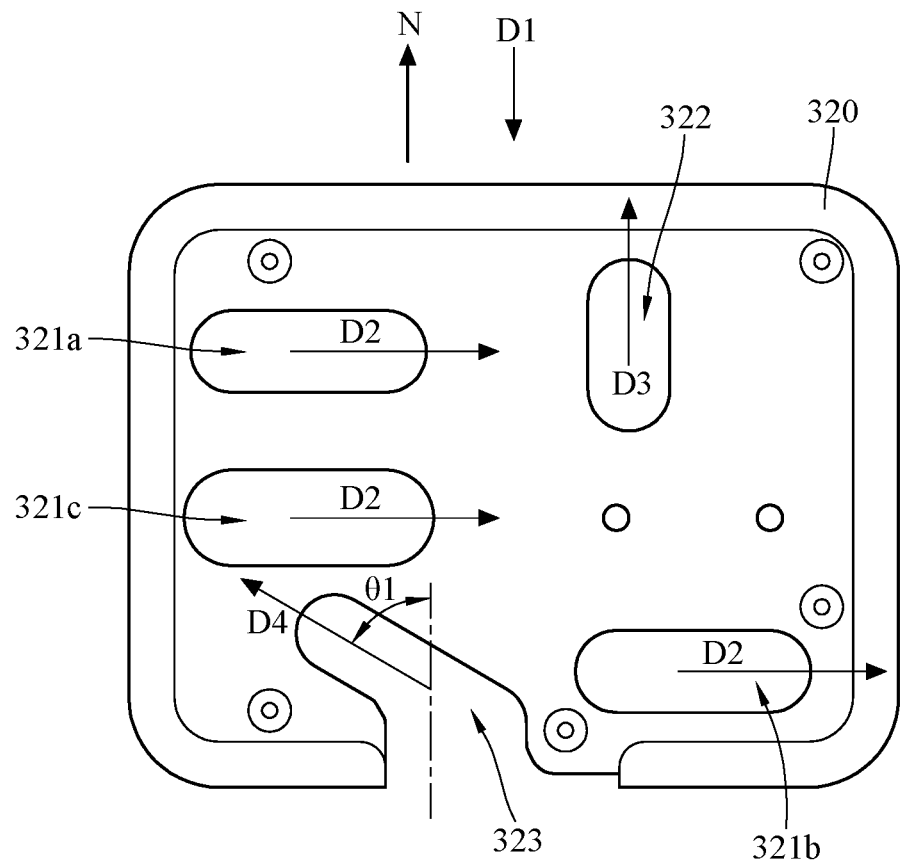
FIG. 5 is a planar schematic view of an installation plate of FIG. 4.

Please refer to FIG. 3 and FIG. 5. FIG. 5 is a planar schematic view of an installation plate of FIG. 4. In this and other embodiments, while the fixing frame assembly 300 is mounted to the chassis 100, engaging the second positioning pillars 420 with the first positioning pillars 410 helps to guide the accommodating frame 310 to move toward the bottom wall 111 of the chassis 100 along an installation direction D1. On the contrary, disengaging the second positioning pillars 420 from the first positioning pillars 410 helps to guide the accommodating frame 310 to move away from the bottom wall 111 of the chassis 100 along a direction opposite to the installation direction D1. The installation direction D1 is substantially parallel to a normal line N of the bottom wall 110 of the chassis 100.

The guiding slots 321a, 321b and 321c all extend along a first direction D2, and the first direction D2 is perpendicular to the installation direction D1. That is, the guiding slots 321a, 321b and 321c are parallel to one another and are perpendicular to the installation direction D1. The connection slot 322 extends along a second direction D3, and the second direction D3 is parallel to the installation direction D1. The installation slot 323 extends along a third direction D4, and the third direction D4 is at an acute angle θ1 to the installation direction D1.

The above extension directions of the guiding slots 321a, 321b and 321c, connection slots 322 and installation slots 323 are not restricted. As long as the first direction D2 and the third direction D4 are not parallel to the installation direction D1, these extension directions can be changed. For example, in other embodiments, the installation direction D1 may be perpendicular to the bottom wall 111; in such a case, the first direction D2 and the third direction D4 are not perpendicular to the bottom wall 111.

Figure 6:
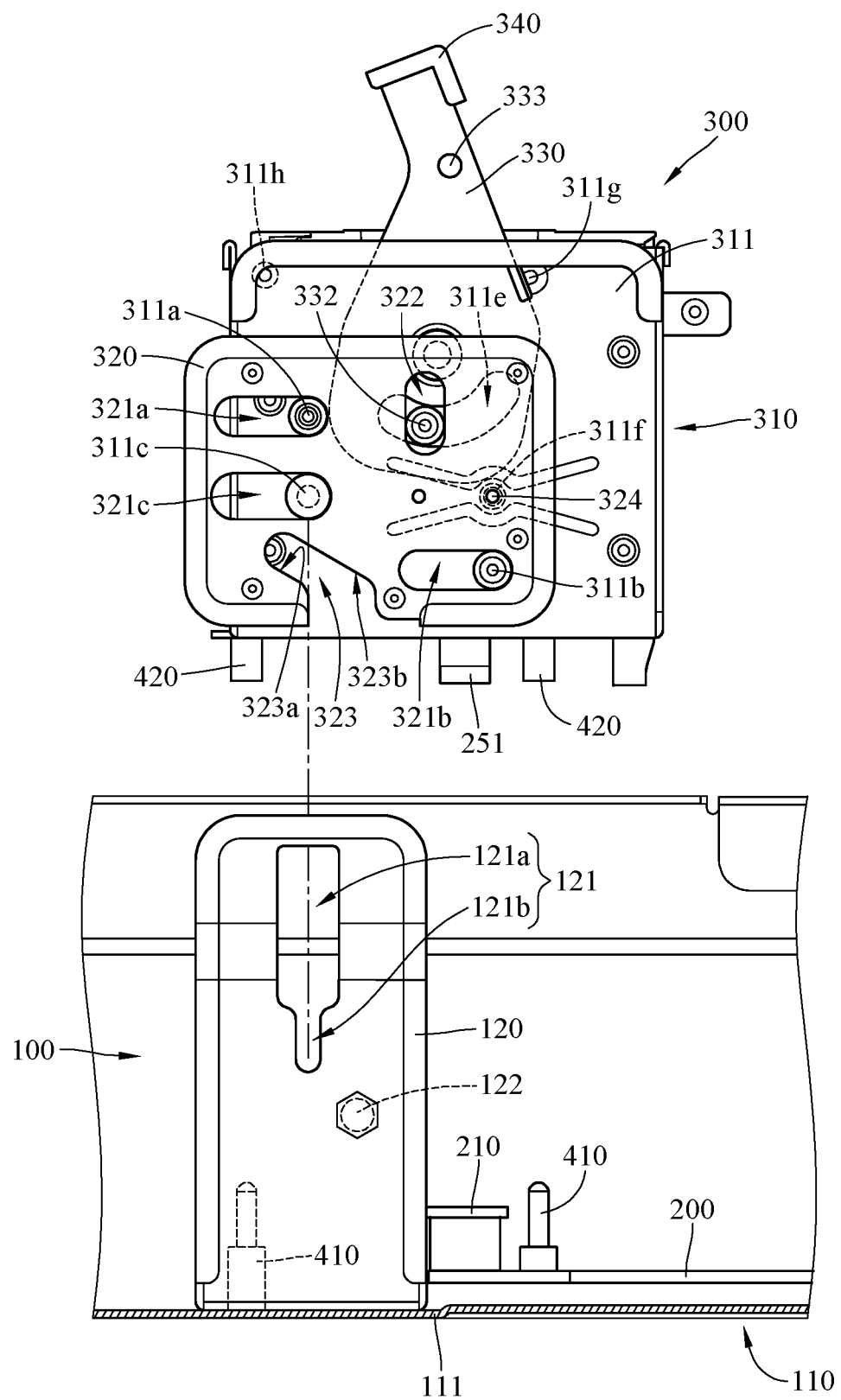
FIG. 6 is a planar schematic view showing that the fixing frame assembly in FIG. 1 is located above a chassis.

Please refer to FIG. 6. FIG. 6 is a planar schematic view showing that the fixing frame assembly in FIG. 1 is located above a chassis. In this and other embodiments, the installation plate 320 may further have two guiding parts 323a, 323b that form the installation slots 323. Due to the cooperation of the accommodating frame 310 and the installation plate 320, when the operative component 330 is pivoted with respect to the accommodating frame 310, the installation plate 320 is slid with respect to the accommodating frame 310, such that the accommodating frame 310 is forced to be moved toward or away from the bottom wall 111 of the chassis 100.

As shown in FIG. 6, in this and other embodiments, the side plate 311 has a first positioning structure 311f. The installation plate 320 has two second positioning structures 324 and 325. During the sliding movement of the installation plate 320 with respect to the side plate 311, the second positioning structure 324 or 325 may be positioned at the first positioning structure 311f. In this embodiment, the first positioning structure 311f is connected with two elastic arms that allow the first positioning structure 311f to be moved toward or away from the installation plate 320, such that when the second positioning structures 324 and 325 are not positioned at the first positioning structure 311f, an interference between the first positioning structure 311f and the installation plate 320 can be reduced. However, the elastic arms are optional; in other embodiments, the side plate may have no such elastic arms connected to the first positioning structure.

As shown in FIG. 6, in this and other embodiments, the side plate 311 may further have a stopping protrusion 311g configured to limit the pivot range of the operative component 330. When the operative component 330 is pivoted with respect to the accommodating frame 310 to be inclined, the stopping protrusion 311g is able to stop the operative component 330 at a specific angle.

As shown in FIG. 6, in this and other embodiments, the side plate 311 of the accommodating frame 310 may further have a first positioning structure 311h, and the operative component 330 may further have a second positioning structure 333. The second positioning structure 333 and the first positioning structure 311h are concave and convex structures that fit each other, such that the second positioning structure 333 is able to be detachably positioned at the first positioning structure 311h.

Figure 11:
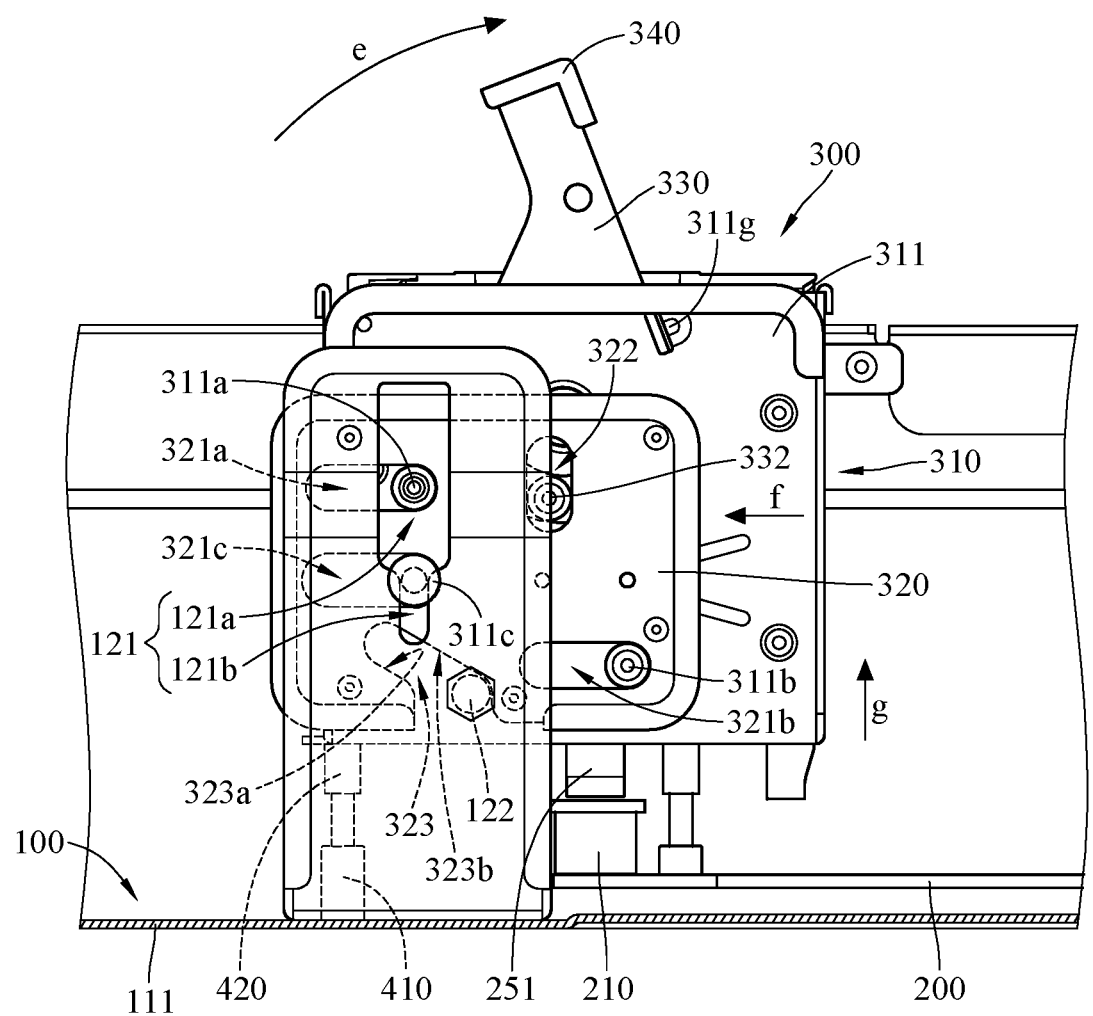
FIG. 11 is a cross-sectional view showing that the fixing frame assembly is located inside the chassis and the installation plate is not assembled to the guiding component.

Please refer to FIG. 6 to FIG. 11. FIG. 7 is a cross-sectional view showing that the fixing frame assembly is located inside the chassis and the installation plate is not assembled to a guiding component. FIG. 8 is another cross-sectional view showing that the fixing frame assembly is located inside the chassis and the installation plate is not assembled to the guiding component. FIG. 9 is a cross-sectional view showing that the fixing frame assembly is located inside the chassis and the installation plate is assembled to the guiding component. FIG. 10 is another cross-sectional view showing that the fixing frame assembly is located inside the chassis and the installation plate is assembled to the guiding component. FIG. 11 is a cross-sectional view showing that the fixing frame assembly is located inside the chassis and the installation plate is not assembled to the guiding component.

As shown in FIG. 6, the fixing frame assembly 300 is located above the chassis 100; that is, the fixing frame assembly 300 is not yet put in the chassis 100. Moreover, the operative component 330 of the fixing frame assembly 300 is inclined with respect to the accommodating frame 310 and the second positioning structure 324 of the installation plate 320 is positioned at the first positioning structure 311f of the side plate 311.

Next, as shown in FIG. 7 and FIG. 8, the fixing frame assembly 300 is placed into the chassis 100 along a direction a. As the guiding pillar 311c starts to engage with the guiding groove 121, the installation slot 323, the second connectors 251 and second positioning pillars 420 are able to be respectively aligned with the assembling pillar 122, the first connectors 210 and the first positioning pillars 410 also. At this moment, the second connectors 251 is not completely inserted into the first connectors 210, the assembling pillar 122 is located on an end of the installation slot 323 that is close to the bottom wall 111, each of the first positioning pillars 410 is partially inserted into the respective second positioning pillar 420, and the guiding pillar 311c is temporarily located on the intersection of the release portion 121a and the engagement portion 121b.

Next, as shown in FIG. 9 and FIG. 10, the operative component 330 is pivoted along a direction b, such that the connection protrusion 332 of the operative component 330 forces the installation plate 320 to slide with respect to the accommodating frame 310 along a direction c. During the movement of the installation plate 320, the assembling pillar 122 is moved along the installation slot 323 so as to force the accommodating frame 310 to move toward the bottom wall 111 of the chassis 100 along a direction d, thereby forcing the second positioning pillars 420 and the second connectors 251 to move along the direction d. As a result, the second positioning pillars 420 are fully engaged with the first positioning pillars 410, and the second connectors 251 are fully connected to the first connectors 210.

In addition, when the operative component 330 is pivoted to the position shown in FIG. 9, the second positioning structure 333 of the operative component 330 is positioned at the first positioning structure 311h of the side plate 311, such that the accommodating frame 310 is firmly fixed on the chassis 100. At the same time, the second positioning structure 325 of the installation plate 320 is also positioned at the first positioning structure 311f of the side plate 311 so as to fix the installation plate 320 in position relative to the side plate 311.

Next, as shown in FIG. 11, the operative component 330 is pivoted along a direction e, and the connection protrusion 332 of the operative component 330 forces the installation plate 320 to slide with respect to the accommodating frame 310 along a direction f During this movement, the assembling pillar 122 is moved along the installation slot 323 so as to force the accommodating frame 310 to move away from the bottom wall 111 of the chassis 100 along a direction g. The second positioning pillars 420 and the second connectors 251 are also moved along the direction g. As a result, the second positioning pillars 420 are disengaged from the first positioning pillars 410, and the second connectors 251 are disconnected from the first connectors 210.

In addition, when the operative component 330 is pivoted to the position shown in FIG. 11, the operative component 330 is stopped at a specific angle by the stopping protrusion 311g, and the second positioning structure 324 of the installation plate 320 is positioned at the first positioning structure 311f of the side plate 311 so as to fix the installation plate 320 in position with respect to the side plate 311. In this way, the fixing frame assembly 300 can be installed into the chassis 100 again.

Figure 12:
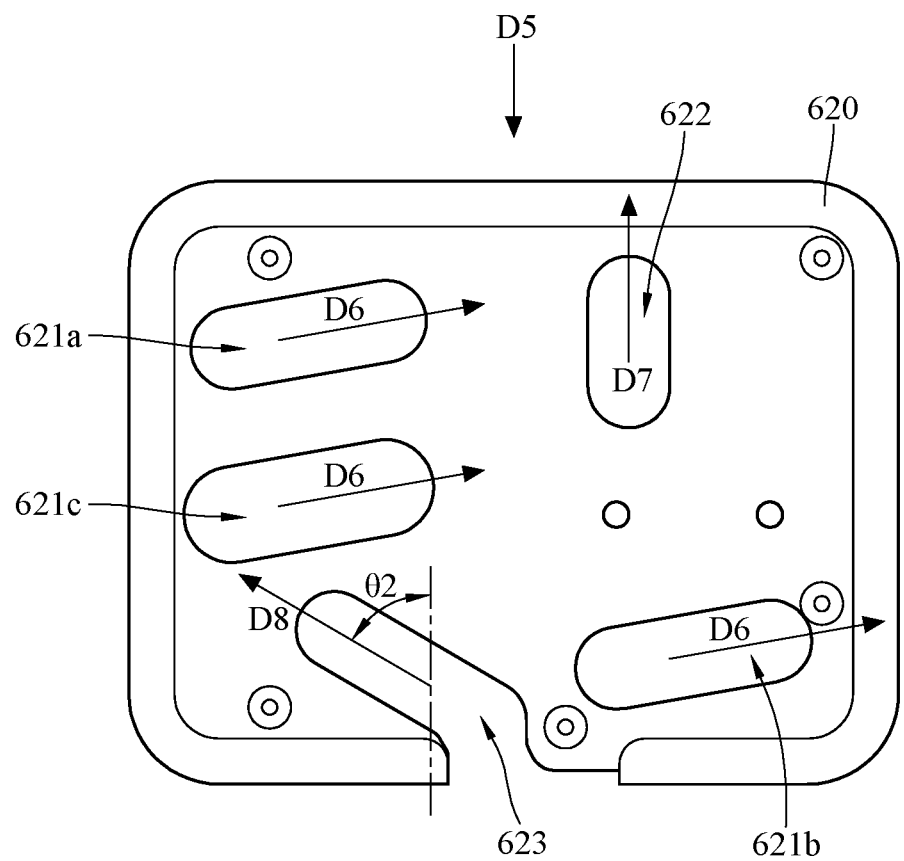
FIG. 12 is a planar schematic view of the installation plate according to a second embodiment of the disclosure.

In above embodiments, the extension directions of the guiding slots 321a, 321b and 321c are perpendicular to that of the connection slot 322, but the disclosure is not limited thereto. Please refer to FIG. 12. FIG. 12 is a planar schematic view of the installation plate according to a second embodiment of the disclosure.

The second embodiment provides an installation plate 620. The installation plate 620 has guiding slots 621a, 621b and 621c, a connection slot 622 and an installation slot 623. The extension direction of the guiding slots 621a, 621b and 621c is not perpendicular to that of the connection slot 622. In detail, the guiding slots 621a, 621b and 621c extend along a first direction D6, and the first direction D6 is not perpendicular to the extension direction of the connection slot 622 (i.e., second direction D7) and is not perpendicular to the installation direction D5; that is, the guiding slots 621a, 621b and 621c are parallel to one another and are not perpendicular to the connection slot 622 and the installation direction D5. The second direction D7 is parallel to the installation direction D5. The installation slot 623 extends along a third direction D8, and the third direction D8 is at an acute angle θ2 to the installation direction D5.

Further, the accommodating frame 310 may not be configured to accommodate fans; in other embodiments, the accommodating frame may be configured to accommodate hard disks or other expansion components.

Additionally, in the disclosure, the quantities of the installation plates 320 and the operative components 330 are not restricted; in other embodiments, the fixing frame assembly may only include one installation plate and one operative component.

Furthermore, in above embodiments, the guiding components 120 are additionally fixed on the casing 110, but the disclosure is not limited thereto. In other embodiments, the guiding components and the casing may be made of a single piece. That is, the guiding component is part of the casing.

According to the fixing frame assembly and the server discussed above, by forcing the installation plate via the connection protrusion of the operative component and the cooperation of the accommodating frame and the installation plate, the fixing frame assembly can be mounted to the chassis or be removed from the chassis only by the operative component.

Furthermore, since the installation plate has the guiding slot, the connection slot and the installation slot, the fixing frame assembly can cooperate with the guiding pillar of the side plate, the connection protrusion of the operative component and the assembling pillar of the guiding component only via the installation plate. In this way, the size of the fixing frame assembly can be further reduced so as to separate the fixing frame assembly from the side plates to form spaces for cable management.

Since the spaces for cable management are formed between the fixing frame assembly and the side plates of the accommodating frame, there is no need to additionally form the openings on the side plates, thereby maintaining the structural strength of the chassis.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A fixing frame assembly, configured to be mounted to an assembling pillar of a chassis, the fixing frame assembly comprising:

an accommodating frame, having at least one guiding pillar;

at least one installation plate, slidably disposed on a side of the accommodating frame, the at least one installation plate comprising at least one guiding slot, a connection slot and an installation slot, the at least one guiding pillar slidably located in the at least one guiding slot, and the assembling pillar configured to be slidably located in the installation slot; and at least one operative component, pivotably disposed on the accommodating frame and having a connection protrusion, the connection protrusion slidably located in the connection slot, wherein the operative component is pivotable with respect to the accommodating frame so as to force the connection protrusion to move the at least one installation plate with respect to the accommodating frame, thereby forcing the accommodating frame to move with respect to the chassis;

wherein an opening of the installation slot is located at a side of the installation plate toward a bottom wall of the chassis;

wherein the accommodating frame comprises two side plates opposite to each other, one of the side plates has an opening, the operative component is located between the two side plates, and the connection protrusion of the operative component is disposed through the opening and is partially located in the connection slot of the installation plate.

2. The fixing frame assembly according to claim 1, wherein the at least one guiding slot extends along a first direction, the connection slot extends along a second direction, the installation slot extends along a third direction, the first direction is not parallel to the second direction and the third direction.

3. The fixing frame assembly according to claim 2, wherein the accommodating frame is able to be moved toward the chassis along an installation direction, and the installation direction is not parallel to the first direction and the third direction.

4. The fixing frame assembly according to claim 3, wherein the first direction is perpendicular to the installation direction, the second direction is parallel to the installation direction, and the third direction is at an acute angle to the installation direction.

5. The fixing frame assembly according to claim 4, wherein the installation plate has two guiding parts that form the installation slot; when the installation plate is slid with respect to the accommodating frame, the installation plate is guided by the two guiding parts and the assembling pillar so that the installation plate forces the accommodating frame to move toward the chassis along the installation direction or away from the chassis along a direction opposite to the installation direction.

6. The fixing frame assembly according to claim 5, wherein the installation direction is parallel to a normal line of the bottom wall of the chassis.

7. The fixing frame assembly according to claim 1, further comprises a link, a quantity of the at least one installation plate and a quantity of the at least one operative component both are two, the installation plates are respectively slidably disposed on two opposite sides of the accommodating frame, the two operative components are respectively pivotably disposed on two opposite sides of the accommodating frame, the two connection protrusions of the two operative components are respectively slidably located in the two connection slots of the two installation plates, and the link is connected to the two operative components.

8. The fixing frame assembly according to claim 1, wherein the accommodating frame has a first pivot structure, the operative component has a second pivot structure, the first pivot structure and the second pivot structure are a pivot shaft and a pivot hole that fit each other, and the second pivot structure is disposed at the first pivot structure.

9. The fixing frame assembly according to claim 1, wherein one of the two side plates has a first positioning structure, the operative component is pivoted to the one of the two side plates and has a second positioning structure, and when the operative component is pivoted with respect to the accommodating frame, the second positioning structure of the operative component is positioned at the first positioning structure of the one of the two side plates.

10. The fixing frame assembly according to claim 1, wherein one of the two side plates has a stopping protrusion, and when the operative component is pivoted with respect to the accommodating frame, the stopping protrusion stops the operative component.

11. The fixing frame assembly according to claim 1, wherein one of the two side plates has a first positioning structure, the installation plate has two second positioning structures, when the accommodating frame is relatively close to the chassis, the first positioning structure is positioned at one of the two second positioning structures, and when the accommodating frame is relatively away from the chassis, the first positioning structure is positioned at the other one of the two second positioning structures.

12. A server, comprises:
a chassis, comprising a casing and two guiding components, the two guiding components disposed in the casing and the two guiding components respectively having a guiding groove and an assembling pillar;
a mother board, having at least one first connector;
at least one fan, having a second connector; and
a fixing frame assembly, comprising:
an accommodating frame, the at least one fan disposed on the accommodating frame, the accommodating frame having two guiding pillars;
two installation plates, respectively slidably disposed on two opposite sides of the accommodating frame, the two installation plates each comprising at least one guiding slot, a connection slot and an installation slot, the two guiding pillars respectively disposed through the two guiding slots and respectively partially slidably located in the two guiding slots, the two assembling pillars respectively configured to be located on the two installation slots; and
two operative components, respectively pivotably disposed on two opposite sides of the accommodating frame, and each having a connection protrusion, the two connection protrusions respectively slidably located in the two connection slots, the two operative components able to be pivoted with respect to the accommodating frame so that the two connection protrusions respectively forcing the two installation plates to be slid with respect to the accommodating frame, due to a cooperation of the accommodating frame and the two installation plates, when the two operative components pivoted with respect to the accommodating frame, the accommodating frame moved with respect to the chassis, when the accommodating frame relatively located close to the chassis, the second connector of the at least one fan inserted into the first connector of the mother board, and when the accommodating frame relatively away from the chassis, the second connector of the at least one fan detached from the first connector of the mother board;
wherein two openings of the two installation slots are respectively located at two sides of the two installation plates toward a bottom wall of the chassis;
wherein the accommodating frame comprises two side plates opposite to each other, the two side plates each have an opening, the two operative components are located between the two side plates, and the two connection protrusions of the two operative components are respectively disposed through the two openings of the two side plates and are respectively partially located in the two connection slots of the two installation plates.

13. The server according to claim 12, wherein the casing comprises a bottom wall and two side walls, the two side walls are respectively connected to two opposite sides of the bottom wall, the two guiding components are disposed on the bottom wall and are located between the two side walls, and the two guiding components are respectively spaced apart from the two side walls by two cable management spaces.

14. The server according to claim 13, wherein the two guiding grooves each have a release portion and an engagement portion that are connected to each other, a width of the release portion is larger than a width of the engagement portion, and the engagement portion is closer to the bottom wall than the release portion, when the accommodating frame is relatively close to the chassis, the two guiding pillars are respectively located on the two engagement portions, and when the accommodating frame is relatively away from the chassis, the two guiding pillars are respectively located on the two release portions.

15. The server according to claim 12, further comprises at least one first positioning pillar and at least one second positioning pillar, the at least one first positioning pillar and the at least one second positioning pillar have concave and convex structures that fit each other, the at least one first positioning pillar is disposed on the bottom wall, the second positioning pillar is disposed on the accommodating frame, and the first positioning pillar is detachably inserted into the second positioning pillar.

16. A fixing frame assembly, configured to be mounted to an assembling pillar of a chassis, the fixing frame assembly comprising:
- an accommodating frame, having at least one guiding pillar;
- at least one installation plate, slidably disposed on a side of the accommodating frame, the at least one installation plate comprising at least one guiding slot, a connection slot and an installation slot, the at least one guiding pillar slidably located in the at least one guiding slot, and the assembling pillar configured to be slidably located in the installation slot; and
- at least one operative component, pivotably disposed on the accommodating frame and having a connection protrusion, the connection protrusion slidably located in the connection slot, wherein the operative component is pivotable with respect to the accommodating frame so as to force the connection protrusion to move the at least one installation plate with respect to the accommodating frame, thereby forcing the accommodating frame to move with respect to the chassis;
- wherein an opening of the installation slot is located at a side of the installation plate toward a bottom wall of the chassis;
- wherein the accommodating frame comprises two side plates opposite to each other, the installation plate is slidably disposed on one of the two side plates, the installation plate has a plurality of bumps, and the installation plate presses against one of the two side plates only via the plurality of the bumps.

* * * * *